United States Patent
Fujii

(10) Patent No.: US 7,518,065 B2
(45) Date of Patent: Apr. 14, 2009

(54) PRINTED WIRING BOARD FOR PLASMA DISPLAY AND PROCESS FOR PRODUCING THE SAME

(75) Inventor: Nobuaki Fujii, Shimonoseki (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 469 days.

(21) Appl. No.: 11/267,792

(22) Filed: Nov. 3, 2005

(65) Prior Publication Data

US 2006/0090928 A1 May 4, 2006

(30) Foreign Application Priority Data

Nov. 4, 2004 (JP) .............................. 2004-321235

(51) Int. Cl.
   *H05K 1/00* (2006.01)
   *H05K 3/02* (2006.01)
(52) U.S. Cl. ..................... 174/254; 361/748; 29/847
(58) Field of Classification Search .............. 174/254; 361/749–751; 29/846–851
   See application file for complete search history.

(56) References Cited

U.S. PATENT DOCUMENTS

| | | | |
|---|---|---|---|
| 4,335,272 A * | 6/1982 | Pittenger ..................... | 174/254 |
| 6,222,135 B1 * | 4/2001 | Daido et al. ................ | 174/250 |
| 6,420,659 B1 * | 7/2002 | Tsutsumi et al. ............ | 174/254 |
| 6,433,284 B1 * | 8/2002 | Lin et al. .................... | 174/254 |
| 6,631,838 B2 | 10/2003 | Kim et al. | |

FOREIGN PATENT DOCUMENTS

| | | |
|---|---|---|
| CN | 1318971 A | 10/2001 |
| JP | 6302941 A | 10/1994 |
| JP | 11220248 A | 8/1999 |
| JP | 2000173351 A | 6/2000 |
| JP | 2001110852 A | 4/2001 |
| JP | 2001-351953 A | 12/2001 |
| JP | 2002270714 A | 9/2002 |
| JP | 2002363259 A | 12/2002 |

OTHER PUBLICATIONS

Hongxun, Ye, Printing Paste for Printing Circuit Board and its Development, Silk Screen Printing, pp. 20-21, Jan. 31, 1999.

* cited by examiner

*Primary Examiner*—Jeremy C Norris
(74) *Attorney, Agent, or Firm*—The Webb Law Firm, P.C.

(57) ABSTRACT

A printed wiring board for a plasma display, comprising: an insulating film having a folding slit(s) provided at its folding position; a wiring pattern provided on at least one surface of the insulating film; and a flame retardant solder resist layer provided so as for a terminal part to be exposed on the surface of the wiring pattern, the folding slit being provided in a divided form in the longitudinal direction of the slit, a flame retardant solder resist layer being provided on the backside of the folding slit, foams or pinholes in the backside flame retardant solder resist layer formed in the divided slit region having been expelled. Even in a printed wiring board to which high voltage is applied, the separation of the flame retardant solder resist layer can be prevented, and, at the same time, the occurrence of pinholes can be reduced.

17 Claims, 6 Drawing Sheets

PRINTED WIRING BOARD FOR PLASMA DISPLAY AND PROCESS FOR PRODUCING THE SAME

FIELD OF THE INVENTION

The present invention relates to a printed wiring board for mounting electronic components thereon for driving a plasma display, and a process for producing the same. More particularly, the present invention relates to a printed wiring board, which mounts electronic components thereon for driving a plasma display to which the applied voltage is high and which, in use, is folded, and a process for producing the printed wiring board.

BACKGROUND OF THE INVENTION

For a film carrier-type wiring board having a three-layer structure comprising, for example, IC chips for driving a liquid crystal connected to a glass substrate for liquid crystal panel formation, folding slits have hitherto been provided from the viewpoint of reducing the frame area of a liquid crystal panel for notebook computers and the like. This film carrier-type wiring board is constructed so that an outlet terminal is connected to the terminal part of the glass substrate constituting the liquid crystal panel and is folded at its slit part and an input terminal is located on the backside of the liquid crystal panel. This film carrier-type wiring board having a three-layer structure with folding slits formed therein is generally produced and supplied in a tape form provided with a number of film carriers. In the above film carrier-type wiring board, however, the thickness of the insulating layer is so small that the provision of folding slits lowers the rigidity of the tape, leading to a problem that the wiring pattern is likely to be broken due to strain caused, for example, during the transfer of the tape. In order to prevent such breakage, for example, Japanese Patent Laid-Open No. 351953/2001 proposes a method in which one slit is formed in the form of a plurality of divided slits to prevent a lowering in rigidity.

Recently, plasma displays (PDPs) which are quite different from liquid crystal panels (LCDs) as described above have drawn attention as visual display units. Unlike liquid crystal panels, in plasma displays, individual elements emit lights, and, thus, a higher brightness than that in liquid crystal panels can be achieved to realize high quality display. Further, in the case of plasma displays, increasing the size of the display is possible, and, thus, plasma displays can be used, for example, as visual display units for large-screen TVs.

In order to drive plasma displays, however, a higher voltage than required for liquid crystal panels should be applied. The film carrier-type wiring board for driving such plasma displays has a larger size than the size of the film carrier-type wiring board for LCD driving, and slits provided for permitting the film carrier-type wiring board, for driving the plasma display, to be used in a folded state should be elongated slits, for example, having a size of 1 mm in width and 50 to 100 mm in length. The formation of such long slits in an insulating film results in lowered rigidity of the film carrier in its slit formed part. Further, it should be noted that mass production of such large slits by a punching press at a high speed with good accuracy is very difficult. Accordingly, also in the film carrier-type wiring board for driving plasma displays, as with the wiring board for LCDs, one slit is formed in the form of a plurality of divided slits by punching.

In driving such PDP, in general, a voltage of not less than 60 V should be applied. This necessitates the adoption of a construction different from that in semiconductor devices for LCD driving. In particular, for film carriers for PDPs, the applied voltage is so high that generation of heat involved in voltage application poses a problem. Therefore, preferably, the film carrier for PDPs has flame retardant properties.

In general, the film carrier comprises a wiring pattern formed of an electrically conductive metal such as copper provided on an insulating film such as polyimide, and the wiring pattern except for its terminal part is covered with a solder resist layer. In this film carrier, the solder resist layer has the lowest heat resistance, and, in order that the film carrier is flame-retardant, the solder resist layer should be flame-retardant.

The solder resist layer is to be selected such that the solder resist layer has good affinity for the insulating film such as polyimide and the wiring pattern and, for example, in the case where folding slits are provided, a flexible solder resist ink is used for solder resist layer formation. There are many solder resist inks which are flexible and have affinity or the like for the wiring pattern or the insulating film. In liquid crystal panels (LCDs), however, since the applied voltage is not so high, rendering the solder resist layer flame-retardant has not been fully studied yet. A general method for rendering a resin flame-retardant is to incorporate a phosphorus compound or the like in the resin. Flame retardants such as phosphorus compounds used for imparting flame retardancy to the resin are finely dispersed in the resin, but on the other hand, they are not unified with the resin. Therefore, upon bleeding of the flame retardant, in some cases, the flame retardant solder resist layer is likely to be separated.

Further, the width of the insulating film is narrow at its part between divided folding slits, and, at the time of slit formation by punching, the insulating film (for example, polyimide film) in its part between slits undergoes strains and, consequently, is somewhat deformed (that is the insulating film in its part between slits is not flat), often making it difficult to smoothly coat the flame retardant solder resist ink onto this uneven part. When coating defects occurs in the flame retardant solder resist ink coated onto the part between such slits, lifting of flame retardant solder resist layer occurs in its part, resulting in abnormal appearance.

The solder resist layer is provided for protecting the wiring pattern, and the solder resist ink is coated with the greatest possible care so as to avoid the inclusion of foams in the solder resist layer. In this case, however, even when air bubbles contained in the solder resist ink could be substantially completely removed, very fine foams are sometimes included depending, for example, upon the contact angle of a squeegee and the state of screen. The included foams become pinholes having a large diameter (formed by foams having a diameter of not less than 1 mm). When pinholes are disadvantageously formed within the divided folding slits, deterioration in strength of adhesion to the insulating film is microscopically significant. In the inside of the divided slits, foams are accidentally formed. Therefore, even when all the air bubbles contained in the solder resist ink are removed, in some cases, fine air bubbles are caught up in the ink in the coating step. The inclusion of air bubbles in the ink and the occurrence of pinholes having a large diameter at the time of coating cannot be completely prevented by only the control of the solder resist ink.

It has been found that, in particular, when foams are included in the divided slits in the backside flame retardant solder resist layer provided on the backside of the insulating film, pinholes are likely to be formed in the flame retardant solder resist layer within the divided slits, particularly in the backside flame retardant solder resist layer in its part near the inner wall of the slits. Further, in particular, the flame retardant solder resist layer in its part between the divided slits on the wiring pattern formed face is likely to be lifted. The reason for lifting of the insulating film in its part between the divided slits has not been elucidated yet. However, possible reasons for lifting of the flame retardant solder resist layer attributable to a failure of adhesion or a failure of coating starts from a part near the divided folding slits, particularly between slits, include that the bleed of the flame retardant contained in the backside flame retardant solder resist layer is likely to concentrate on this part, that, in addition, the width of the insulating film in its part between the divided slits is very narrow and is not more than 5 mm, that, in the formation of divided slits by press punching, the insulating film such as polyimide undergoes strains and, consequently, in many cases, the surface of the insulating film in its part between the divided slits become uneven and the affinity of the flame retardant solder resist ink for the uneven part is likely to be lowered, and that, as compared with LCDs, the area of the individual divided slits is large.

In plasma displays of which the demand is being rapidly expanded, the voltage applied to the film carrier-type wiring board on which electronic components for driving the plasma display are mounted is high, and, thus, the development of a method for preventing the separation of the flame retardant solder resist layer susceptible to heat generated by the high applied voltage is urgently in need.

SUMMARY OF THE INVENTION

Accordingly, an object of the present invention is to provide a printed wiring board for a plasma display, having folding slits formed in a divided form by punching, in which pinholes are less likely to be formed in a backside flame retardant solder resist layer provided by coating on the divided folding slits and separation is less likely to be formed in the backside flame retardant solder resist layer, and a process for producing said printed wiring board for a plasma display.

According to one aspect of the present invention, there is provided a printed wiring board for a plasma display, comprising: an insulating film having a folding slit(s) provided at its folding position; a wiring pattern provided on at least one surface of the insulating film; and a flame retardant solder resist layer provided so as for a terminal part to be exposed on the surface of the wiring pattern, wherein said folding slit being provided in a divided form in the longitudinal direction of the slit, a flame retardant solder resist layer being provided on the backside of said folding slit, foams in said backside flame retardant solder resist layer formed in the divided slit region having been expelled. In the present invention, the term "foams" as used herein means not only foams but also pinholes formed by large foams.

According to another aspect of the present invention, there is provided a process for producing a printed wiring board for a plasma display, comprising the steps of: providing an insulating film; forming a folding slit in the form of a plurality of divided folding slits in said insulating film at its position corresponding to a position at which said insulating film is to be folded; disposing an electrically conductive metal layer on a surface of said insulating film; forming a backside flame retardant solder resist layer on the backside of the insulating film, which is reverse side of said electrically conductive metal layer, at its folding slit formed position; forming a photosensitive resin layer on the surface of said electrically conductive metal layer; exposing and developing said photosensitive resin layer to form a desired pattern; selectively etching the electrically conductive metal layer using the pattern as a masking material to form a wiring pattern; then coating a flame retardant solder resist ink so that said wiring pattern in its terminal part is exposed, thereby forming a flame retardant solder resist layer and thus to produce a printed wiring board for a plasma display, wherein the step of expelling foams contained in the coated backside flame retardant solder resist ink is provided between the step of coating the backside flame retardant solder resist ink onto the backside of the insulating film in its folding slit formed position and the step of curing the backside flame retardant solder resist ink to form the backside flame retardant solder resist layer.

Regarding the separation phenomenon of the backside flame retardant solder resist layer in its part between divided folding slits, the present inventor has made extensive and intensive studies on causes of the separation phenomenon and as a result has found that, when very fine foams are contained in the backside flame retardant solder resist layer filled into the divided folding slits, the separation of the backside flame retardant solder resist layer occurs at that part with high probability. Further, the present inventor has found that when folding slits are formed in a divided form, lifting of the flame retardant solder resist layer often starts from a part between the divided slits. In general, a measure is taken so as to avoid the formation of foams in the solder resist layer provided in the printed wiring board. In this connection, however, it should be noted that the conventional prevention of air bubble inclusion in the solder resist layer is carried out from the viewpoints of preventing corrosion of the wiring pattern caused by the inclusion of foams and preventing migration and the like, and, hence, even though foams are included, this inclusion is much less likely to pose such a serious problem that the reliability of the printed wiring board is overthrown. On the other hand, in the printed wiring board on which electronic components for driving a plasma display are mounted, the applied voltage is so high that the circuit board with electronic components, for driving a plasma display, mounted thereon per se is likely to generate heat and, in addition, when the printed wiring board is used in a folded state, the solder resist layer disposed on the backside of the printed wiring board in which the heat is likely to be accumulated should be flame-retardant and, at the same time, foams or pinholes, formed within the divided slits, which are likely to serve as a start point of the separation of the backside flame retardant solder resist layer should be completely removed.

In the present invention, the solder resist layer formed by coating on this backside is rendered flame-retardant, and a measure is of course taken so as to avoid the inclusion of foams in the solder resist layer. In the present invention, even though foams are included, after the flame retardant solder resist ink is coated onto the insulating film in its divided slit formed position, rather than curing of the solder resist ink immediately after the coating, the solder resist ink is once allowed to stand in such a state that the solder resist ink is viscous to expel the included foams, followed by curing of the solder resist ink to form the backside flame retardant solder resist layer. Therefore, the separation of the backside flame retardant solder resist layer from the insulating film in its part between the backside divided slits can be effectively prevented.

In the printed wiring board for a plasma display according to the present invention, the slit for folding the printed wiring board are provided in a divided form, and a backside flame retardant solder resist layer is provided in the divided folding slits from the backside of the insulating film. Further, a measure is taken so as to expel foams from the backside flame retardant solder resist layer within the divided slits. In this part, the quantity of pinholes formed is not significant. The separation of the flame retardant solder resist layer within the divided slits can be effectively prevented by a method in which the coated flame retardant solder resist ink is once allowed to stand to improve the affinity for the insulating film before the coated flame retardant solder resist ink is cured. Further, when the printed wiring board for a plasma display is provided in multiple rows, lifting of the flame retardant solder resist layer in its part between slits on the wiring pattern side can be effectively prevented by providing them symmetrically with respect to an imaginary boundary line between them.

For example, the printed wiring board for a plasma display according to the present invention as described above has flame retardance on a high level of V=0 as determined according to UL94V standards, and this flame retardance is not deteriorated even after use for a long period of time.

BRIEF DESCRIPTION OF THE DRAWINGS

FIG. 7 is a device for measuring the folding endurance of a backside flame retardant solder resist layer used in the present invention; wherein:

10 . . . printed wiring board for plasma display,
   11 . . . insulating film,
   12 . . . wiring pattern,
   13 . . . sprocket hole,
   14 . . . device hole,
   15*a*, 15*b*, 15*c*, 15*d* . . . folding slits,
   16*a*, 16*b* . . . part between slits
   17 . . . backside flame retardant solder resist layer,
   18 . . . flame retardant solder resist layer,
   19 . . . plating layer,
   20 . . . terminal part,
   21 . . . film carrier A,
   22 . . . film carrier B,
   23 . . . imaginary boundary line,
   25 . . . electrically conductive metal layer (or wiring pattern),
   121 . . . film carrier A, and
   122 . . . film carrier B.

DETAILED DESCRIPTION OF THE INVENTION

The printed wiring board for a plasma display according to the present invention and a process for producing the same will be described in more detail.

Figure 1:
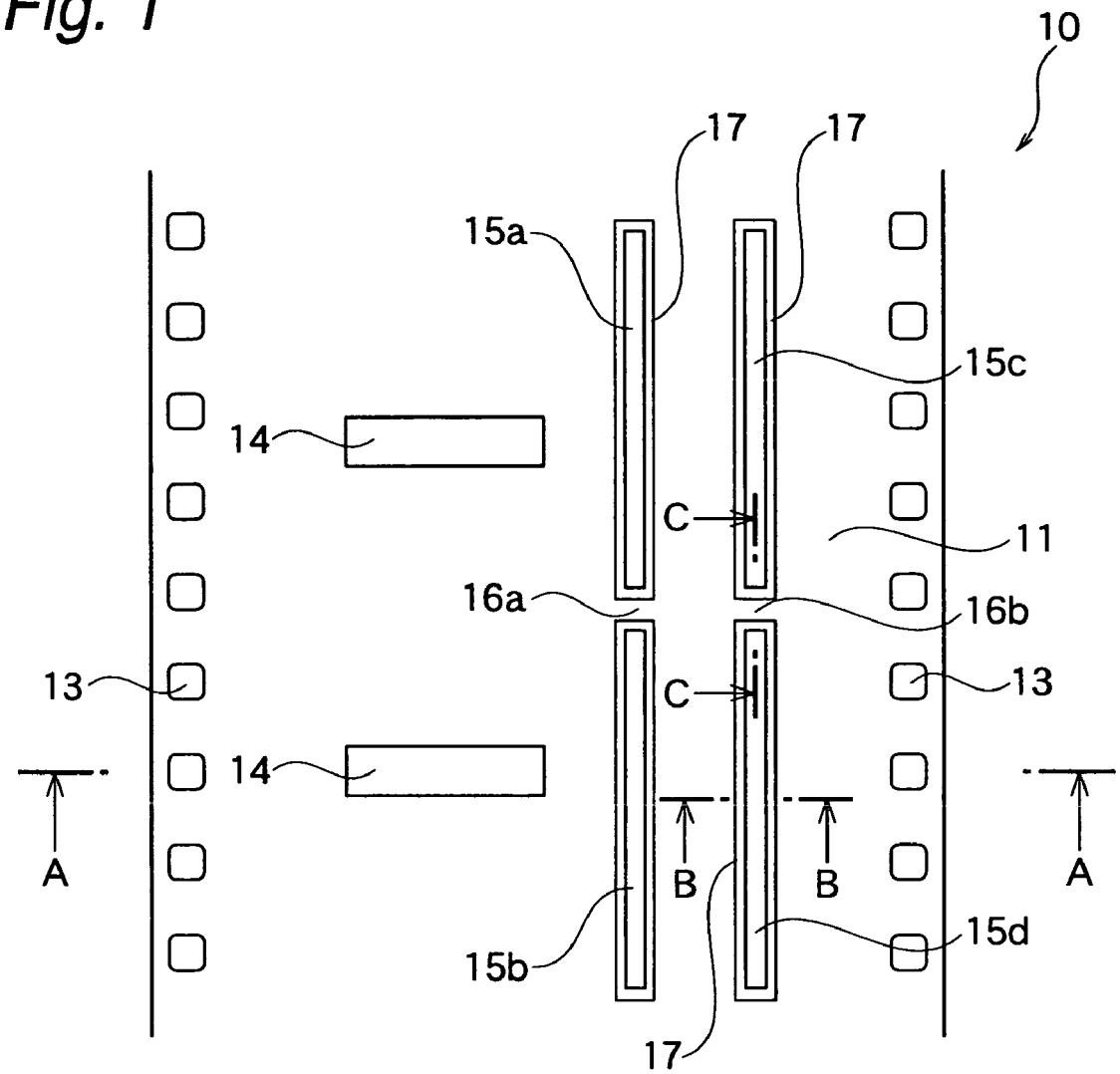
FIG. 1 is a bottom view of an embodiment of the printed wiring board for a plasma display according to the present invention, and a cross-sectional view taken on line A-A of the bottom view.
Figure 1:
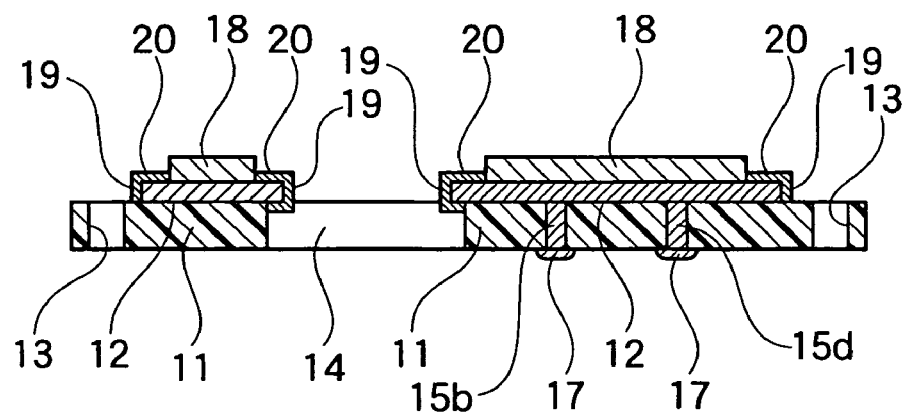
Figure 2:
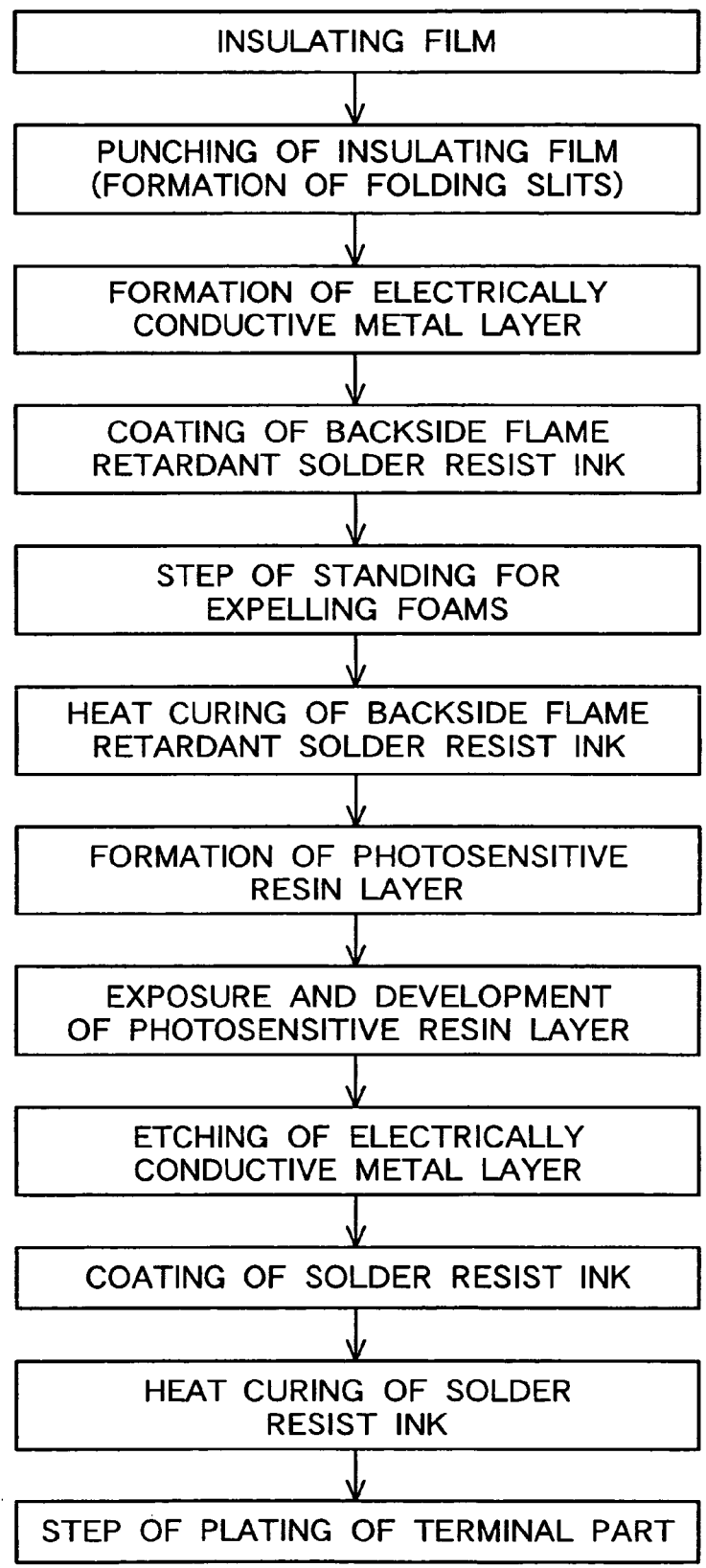
FIG. 2 is a process chart showing an embodiment of a process for producing the printed wiring board for a plasma display according to the present invention.

FIG. 1 is a bottom view of an embodiment of the printed wiring board for a plasma display according to the present invention, and a cross-sectional view taken on line A-A of the bottom view, and FIG. 2 a process chart showing an embodiment of a process for producing the printed wiring board for a plasma display according to the present invention.

The printed wiring board for a plasma display according to the present invention will be described in conjunction with the process chart in FIG. 2.

As shown in FIG. 1, a printed wiring board 10 for a plasma display according to the present invention includes an insulating film 11. Folding slits 15*a*, 15*b*, 15*c*, 15*d* are provided in the insulating film 11. A wiring pattern 12 is provided on a surface of the insulating film 11. A flame retardant solder resist layer 18 is provided on a surface of the wiring pattern 12. A backside flame retardant solder resist layer 17 is provided on the reverse side of the insulating film 11 in its parts where folding slits 15*a*, 15*b*, 15*c*, 15*d* are provided.

Insulating films usable as the insulating film 11 in the present invention include polyimide films, polyimide-amide films, polyester films, polyphenylene sulfide films, polyether imide films, fluororesin films, and liquid crystal polymer films. The insulating film 11 has acid resistance and alkali resistance on such a level that is not corroded by an etching liquid used in etching or an alkali solution used in cleaning or the like, and heat resistance on such a level that is not significantly heat deformed upon heating, for example, at the time of mounting of electronic components. Polyimide films are preferred as the insulating film 11 having such properties.

The average thickness of the insulating film 11 is generally 5 to 150 μm, preferably 5 to 125 μm, particularly preferably 25 to 75 μm.

Necessary through-holes such as sprocket holes 13, device holes 14, folding slits 15*a*, 15*b*, 15*c*, 15*d*, and positioning holes (not shown) are formed in the insulating film 11 by punching.

In this connection, it should be noted that the printed wiring board for a plasma display has a larger size than printed wiring boards, for example, for LCDs and, thus, the overall length of the slits provided at the folding position reaches 50 to 100 mm. Therefore, the formation of one slit having this length by single punching press stroke is likely to cause the deviation of the position of the slit from a predetermined position. To overcome this problem, in the printed wiring board for a plasma display, as shown in FIG. 1, one slit is constituted by a plurality of divided slits. In FIG. 1, reference characters 15*a*, 15*b* respectively designate two divided slits which constitute one folding slit, and reference characters 15*c*, 15*d* respectively designate two divided slits which constitute another folding slit. Accordingly, an inter-slit part 16*a* exists between the folding slits 15*a* and 15*b*, and an inter-slit part 16*b* exists between the folding slits 15*c* and 15*d*. The inter-slits parts 16*a*, 16*b* each are formed of the insulating film 11 in its part remaining unpunched. The length of the divided slits 15*a* and 15*b* constituting the folding slit and the length of the divided slits 15*c* and 15*d* constituting the folding slit are each generally not more than 50 mm, preferably not more than 40 mm, and the width of each of the folding slits is generally 0.3 to 5 mm, preferably about 0.6 to 3 mm. That is, when the formation of a slit having a length exceeding 50 mm is contemplated, this slit is formed in a divided form from the viewpoint of accuracy of the punching press. The width of the inter-slit part 16*a* formed between the folding slits 15*a* and 15*b* which are dividedly provided by a punching press, and the width of the inter-slit part 16*b* formed between the folding slits 15*c* and 15*d* which are dividedly provided by a punching press, are each generally 0.4 to 5 mm, preferably about 0.5 to 3 mm.

After the folding slits 15*a*, 15*b*, 15*c*, 15*d* are dividedly formed in the insulating film 11, an electrically conductive metal layer 25 is formed on a surface of the insulating film 11. A voltage of not less than 60 V is generally applied to the printed wiring board 10 for a plasma display according to the present invention. That is, the voltage applied to the printed wiring board 10 for a plasma display according to the present invention is much higher than the voltage generally applied, for example, to printed wiring boards for LCDs (for example, about 12 V). Accordingly, in the printed wiring board 10 for a plasma display according to the present invention, the electrically conductive metal layer 25 for wiring pattern 12 formation is preferably formed of a highly electrically conductive metal from the viewpoint of minimizing the generation of heat upon application of a high voltage. Highly electrically conductive metals include copper, copper alloys, aluminum, and aluminum alloys. In the present invention, copper is particularly preferred as the electrically conductive metal. In the present invention, the electrically conductive metal may be in the form of a bilayer tape formed by depositing the electrically conductive metal directly on the insulating film 11. In this case, in the formation of the bilayer tape, an insulating film may be superimposed by a casting process onto an electrically conductive metal foil. Alternatively, a method may be adopted in which other metal such as nickel or chromium is vapor deposited onto an insulating film to form a substrate metal layer followed by deposition of an electrically conductive metal on the surface of the substrate metal layer. The electrically conductive metal may also be thermocompression bonded as an electrically conductive metal foil onto a surface of the insulating film 11.

When the wiring pattern 12 in the printed wiring board for a plasma display according to the present invention is formed of copper, the electrically conductive metal layer may be formed by disposing a copper foil on a surface of the insulating film 11. Electrodeposited copper foils and rolled copper foils may be mentioned as the copper foil usable in this case. In the present invention, any of the above copper foils may be used.

In the present invention, the electrically conductive metal is provided in a thickness corresponding to the line width of the wiring pattern 12 to be formed. In general, however, the thickness of the electrically conductive metal is in the range of 2 to 70 μm, preferably 6 to 35 μm. When an electrically conductive metal foil is used in the formation of the electrically conductive metal layer, the insulating film 11 and the electrically conductive metal layer 25 may be laminated through an adhesive layer (not shown), or, for example, by dissolving or melting the surface of the insulating film 11 and applying the electrically conductive metal layer 25 to the insulating film 11 without the aid of any adhesive.

After the formation of the electrically conductive metal layer 25 onto the surface of the insulating film 11 by the above method, when the laminate is viewed from the reverse side of the insulating film 11, the backside of the electrically conductive metal layer (or wiring pattern) 25 is covered by the insulating film 11 except for the part of the folding slits 15*a*, 15*b*, 15*c*, 15*d*. That is, in the part of the folding slits 15*a*, 15*b*, 15*c*, 15*d*, the electrically conductive metal layer is exposed.

In the present invention, a flame retardant solder resist ink is coated from the backside of the insulating film 11 to the part of the folding slits 15*a*, 15*b*, 15*c*, 15*d* to form a backside flame retardant solder resist layer 17 so as to cover the electrically conductive metal layer 25 exposed to the folding slits 15*a*, 15*b*, 15*c*, 15*d*.

The solder resist ink coated from the backside of the insulating film 11 in the production of the printed wiring board 10 for a plasma display according to the present invention is a solder resist ink that can form a backside flame retardant solder resist layer 17 having flame retardance on a level of V=0 as determined according to UL94V standards.

Figure 7:
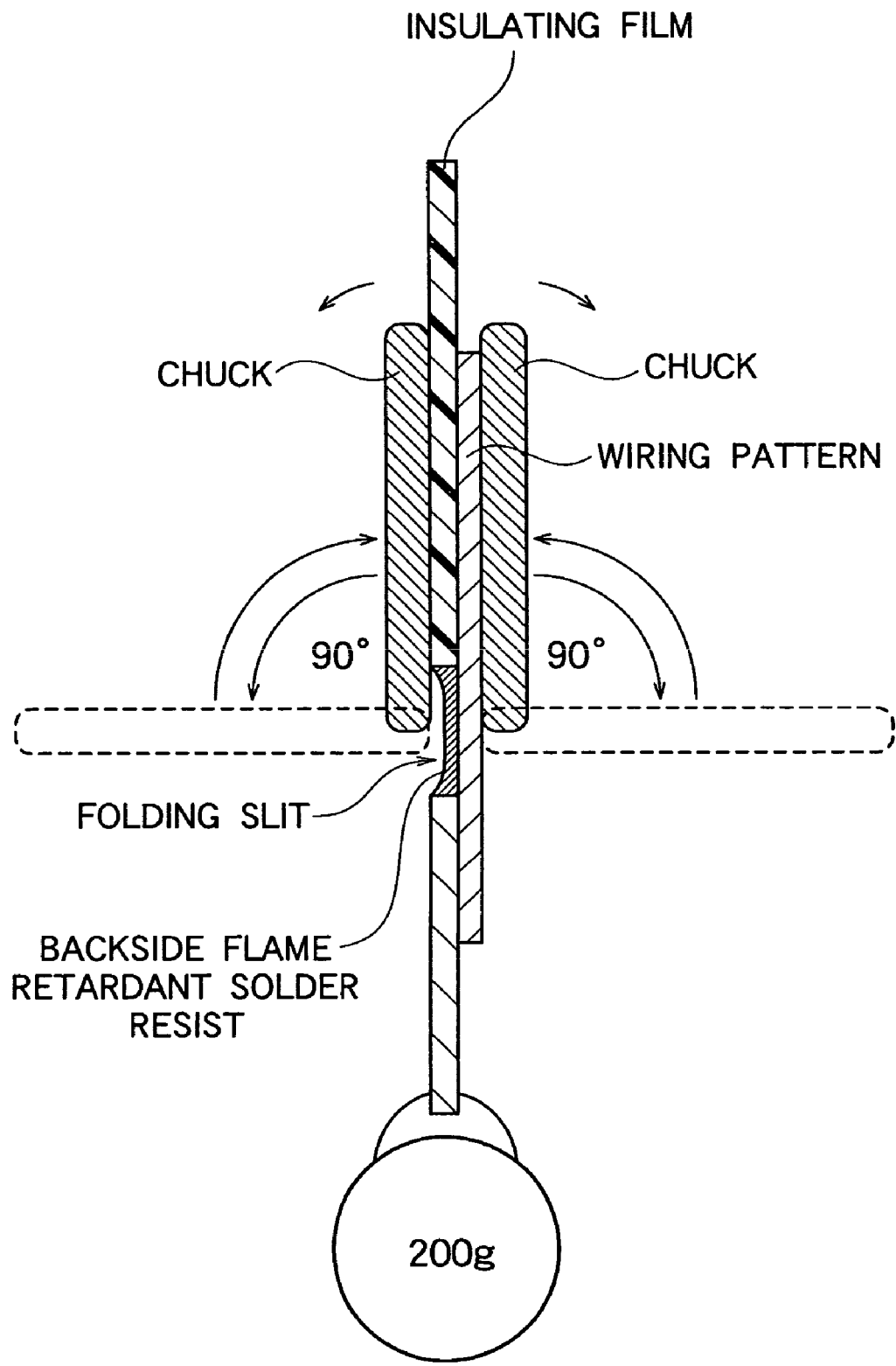

Further, it should be noted that, since the printed wiring board 10 for a plasma display is used in such a state that the printed wiring board 10 has been folded at the slit part, the resin constituting the backside flame retardant solder resist ink filled into the slits is preferably a resin having flexibility high enough to withstand the use in the folded state. More specifically, the folding endurance of the resin is preferably such that the resin can withstand 30 or more reciprocating folding cycles, preferably 50 or more reciprocating folding cycles, without causing any abnormal phenomenon, as measured with a device as shown in FIG. 7. FIG. 7 shows a device for measuring the folding endurance of a backside flame retardant solder resist layer in a printed wiring board. The printed wiring board shown in the drawing comprises an insulating film having a folding slit, a wiring pattern formed on a surface of the insulating film, and a backside flame retardant solder resist layer formed in the folding slit part. The upper part of the printed wiring board is held so that the front end of chucks in the device is located at the center of the slit part in the printed wiring board. A weight of 200 g is added to the lower end of the printed wiring board. The folding slit part is folded to the right and left each at 90 degrees to add bending stress to the backside flame retardant solder resist layer and thus to measure the folding endurance of the backside flame retardant solder resist layer. In the present invention, preferably, the flame retardant solder resist ink can form a flame retardant solder resist layer, which can usually withstand folding to the right and left in 30 or more reciprocating folding cycles, preferably 50 or more reciprocating folding cycles, without causing any abnormal phenomenon.

The resin constituting the flame retardant solder resist ink coated from the backside of the insulating film is not particularly limited so far as it has the above-described properties. Examples thereof include polyimide resins and urethane resins. The solder resist ink filled into the folding silts in the printed wiring board for a plasma display according to the present invention has flame retardance on a level of V=0 as determined according to UL94V standards. This solder resist ink may be prepared using a resin having flame retardance on a level of V=0 as determined according to UL94V standards. In this connection, it should be noted that the resin per se used for solder resist ink preparation is not always required to have such excellent flame retardance. For example, in the case where a flame retardant component, a flame retardant or the like, which will be described later, is incorporated in the solder resist ink and the flame retardance of a cured product of the solder resist ink is on a level of V=0 as determined according to UL94V standards, this cured product suffices for satisfying the requirement of the present invention. In the present invention, polyimide is particularly preferred as the resin for forming the above backside flame retardant solder resist layer 17.

Further, preferably, at least one flame retardant component selected from the group consisting of aluminum hydroxide, magnesium hydroxide, and zinc molybdate is incorporated in the backside solder resist ink containing the above resin component from the viewpoint of imparting flame retardance, on a level of V=0 as determined according to UL94V standards, to the solder resist ink.

The incorporation of the flame retardant component can render the solder resist layer, formed in the folding slits 15a, 15b, 15c, 15d on the backside of the insulating film 11, flame-retardant, irrespective of the type of the resin component for constituting the solder resist ink. The amount of the flame retardant component incorporated may be properly determined in such a range that the backside flame retardant solder resist layer 17 has flame retardance on a level of V=0 as determined according to UL94V standards. In general, however, the amount of the flame retardant component incorporated is in the range of 5 to 20 parts by weight based on 100 parts by weight of the resin component contained in the solder resist ink.

Furthermore, preferably, a flame retardant such as a phosphoric ester is incorporated in the solder resist ink.

Figure 4:
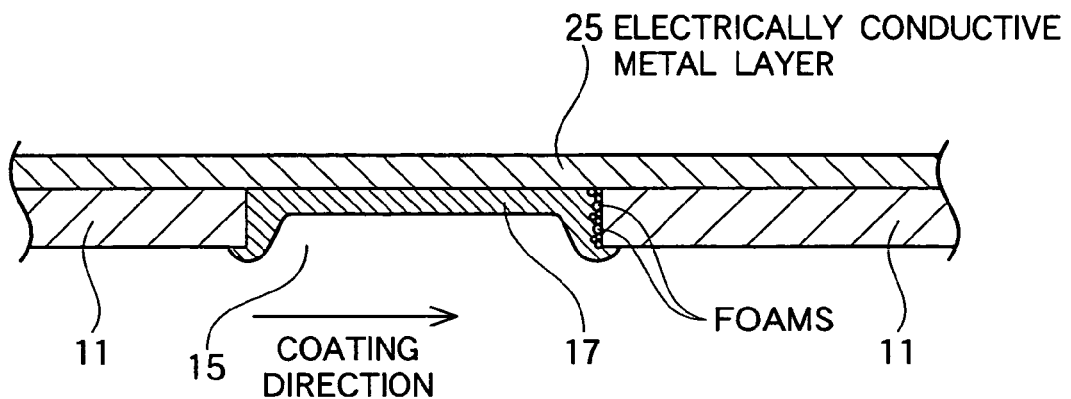
FIG. 4 is a cross-sectional view taken on line B-B of FIG. 1.
Figure 5:
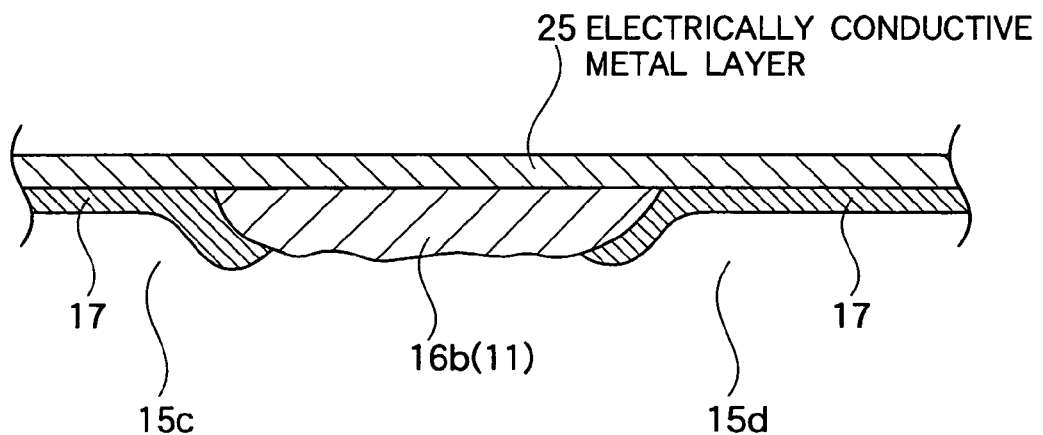
FIG. 5 is a cross-sectional view taken on line C-C of FIG. 1.

The above solder resist ink for the backside of the insulating film used in the printed wiring board for a plasma display according to the present invention is a solution or dispersion of the above resin component, flame retardant component and flame retardant in a solvent. Specifically, since the backside solder resist ink is coated onto the part of the folding slits 15a, 15b, 15c, 15d formed in the insulating film 11, for example, by a screen printing technique, the viscosity of this solder resist ink should be such that the solder resist ink can be passed through the screen and the coated solder resist ink does not flow out before curing. In general, the above resin component, flame retardant component, and flame retardant are dissolved or dispersed in an organic solvent or the like, and the viscosity of the ink is regulated by varying the amount of the organic solvent. Further, prior to coating, the solder resist ink is deaerated, for example, by vacuum deaeration, to remove air, that is, air bubbles, contained in the ink. The viscosity is also regulated so that the deaeration can be smoothly carried out without difficulties. In the printed wiring board 10 for a plasma display according to the present invention, the viscosity of the solder resist ink coated on the backside of the insulating film 11 is generally regulated in the range of 500 to 10000 cps, preferably in the range of 1000 to 8000 cps, as measured at 25° C. The above viscosity of the backside flame retardant solder resist ink is lower than that of the solder resist ink for flame retardant solder resist layer 18 formation on the surface of the wiring pattern 12 formed on the surface of the insulating film 11, and the use of the solder resist ink having a viscosity regulated in this way is advantageous in that, in filling the ink into the folding slits 15a, 15b, 15c, 15d, it is less likely that, for example, as shown in FIG. 4, a part of the slit wall surface (edge of the insulating film) at the front end in the coating direction of the solder resist ink is not coated and the uncoated parts remain as foams in the backside flame retardant solder resist layer. Further, even when foams are disadvantageously formed, the foams can easily be expelled from the solder resist ink coating layer by the step of standing provided before heat curing. Further, even in the case where the smoothness of the surface of the inter-slit parts 16a, 16b has been lost by punching adopted in the formation of the slits, the use of the solder resist ink having the above viscosity enables the solder resist ink to be coated so as to conform to the surface shape. Furthermore, even when residual stress exists in the inter-slit parts 16a, 16b, the solder resist ink has a high level of affinity for the inter-slit parts 16a, 16b and can absorb the inherent stress. Therefore, when the solder resist ink having the above viscosity is used, a foam-free backside flame retardant solder resist layer 17 can be easily formed. In this case, further, the affinity for the insulating film in its parts, for example, constituting the inter-slit parts 16a, 16b is enhanced, and, thus, the backside flame retardant solder resist layer 17 is less likely to be separated.

In producing the printed wiring board for a plasma display according to the present invention, after the formation of the electrically conductive metal layer, the above solder resist ink is coated in the part of the folding slits 15a, 15b, 15c, 15d from the backside of the insulating film 11 to cover the electrically conductive metal exposed in the folding slits 15a, 15b, 15c, 15d. This solder resist ink is generally coated by screen printing. In this case, however, since the insulating film 11 is absent in the folding slits 15a, 15b, 15c, 15d, voids which generate foams are likely to be formed on the slit wall surface at the front end in the coating direction of the solder resist ink.

For example, in a printed wiring board with electronic components mounted for LCD driving, when slits or the like are provided in the insulating film 11, in the step of etching in which a resin is coated in the slits from the backside of the insulating film 11 to form a wiring pattern, it is common practice to use the resin for preventing the electrically conductive metal layer from being etched from the backside of the insulating film, and the presence of foams in the resin layer formed on the backside of the insulating film 11 hardly pose any problem. That is, bringing the resin layer to such a state that foams are not present in the resin layer at all is substantially impossible for production techniques reasons, and foams having a diameter of less than 1 mm pose no problem, while foams having a diameter of not less than 1 mm become pinholes that deteriorate appearance. In the printed wiring board for a plasma display, however, the applied voltage is so high that the whole printed wiring board should be rendered flame-retardant (V=0 as determined according to UL94V standards). To this end, a flame retardant is generally incorporated in the backside flame retardant solder resist layer. As described above, phosphoric ester compounds are in many cases used as the flame retardant. This flame retardant, however, does not dissolve in the resin component for backside flame retardant solder resist layer formation and is present as a dispersion in the resin component in the backside flame retardant solder resist layer. The above flame retardant is a component that is likely to bleed with the elapse of time. When the flame retardant bleeds to a part having adhesive strength which has been lowered due to the formation of pinholes, the adhesive strength at this part is further lowered, often leading to separation of the backside flame retardant solder resist layer.

In the present invention, the step of expelling foams or pinholes contained in the coated solder resist ink is provided in a stage after coating of the backside flame retardant solder resist ink and before curing of the backside flame retardant solder resist ink.

In the step of expelling the foams or pinholes, after coating of the backside flame retardant solder resist ink, in such a state that the resin component contained in the solder resist ink is not cured, the backside flame retardant solder resist ink coating layer is allowed to stand to expel the foams and the like contained in the coating layer by taking advantage of the fluidity of the solder resist ink. More specifically, in a stage after coating of the solder resist ink and before curing of the resin component contained in this solder resist ink, the step of allowing the solder resist ink coating layer to stand generally for 0.5 to 6 min, preferably 1 to 3 min is provided. Since, in this step, the foams and the like contained in the coating layer are expelled by taking advantage of the fluidity of the solder resist ink, this step is carried out under conditions that are less likely to cause a lowering in viscosity of the solder resist ink. This step may be carried out under the atmospheric pressure or reduced pressure. In particular, when this step is carried out under reduced pressure, the foams and the like contained in the backside flame retardant solder resist ink coating layer can be effectively expelled. In this case, however, when the pressure is excessively reduced, the solder resist ink is sometimes scattered when the foams and the like are expelled. For this reason, the pressure is generally set in the range of 0.1 to 1 atm, preferably 0.5 to 1 atm. Further, the temperature at that time is preferably such that a curing reaction of the resin component contained in the solder resist ink coating layer does not proceed excessively and, further, the solvent contained in the solder resist ink coating layer is not rapidly removed. In general, the temperature is in the range of a temperature around room temperature to a temperature at which a curing reaction of the resin component proceeds, specifically in the range of 15 to 80° C., preferably 20 to 50° C.

The provision of the step of expelling foams or pinholes contained in the backside flame retardant solder resist ink coating layer can reduce the amount of foams and the like contained in the backside flame retardant solder resist ink coating layer within or around the folding slits 15*a*, 15*b*, 15*c*, 15*d*.

The step of standing for expelling foams and the like is followed by the step of curing the resin component contained in the backside flame retardant solder resist ink coating layer.

The thickness of the backside flame retardant solder resist layer (thickness after curing) thus formed is smaller than the thickness of the insulating film for folding purposes and is generally in the range of 5 to 60 μm. When the thickness of the backside flame retardant solder resist layer 17 is outside and smaller than the above-defined thickness range, in some cases, the wiring pattern 12 from the backside in the folding slits 15*a*, 15*b*, 15*c*, 15*d* cannot be satisfactorily protected. On the other hand, when the thickness of the backside flame retardant solder resist layer 17 is outside and larger than the above-defined thickness range, the efficiency of removal of foams or the like from the backside flame retardant solder resist layer 17 is lowered. Further, in this case, when the printed wiring board 10 for a plasma display according to the present invention is folded for use, folding at folding slits 15*a*, 15*b*, 15*c*, 15*d* sometimes becomes difficult.

After the formation of the backside flame retardant solder resist layer 17, a photosensitive resin pattern is formed by coating a photosensitive resin onto the surface of the electrically conductive metal layer 25 disposed on the surface of the insulating film 11 that is reverse side of the backside flame retardant solder resist layer 17 and exposing and developing the photosensitive resin layer to form a desired pattern.

Subsequently, the photosensitive resin pattern thus formed is used as a masking material for selective etching of the electrically conductive metal layer to form a wiring pattern 12.

After the formation of the wiring pattern 12 thus formed, the photosensitive resin pattern used as the masking material can easily be removed, for example, by washing with an alkali.

A flame retardant solder resist layer 18 is formed on the wiring pattern 12. Specifically, the flame retardant solder resist layer 18 is formed on the surface of the wiring pattern 12 by coating a flame retardant solder resist ink by a screen printing technique so as to expose the terminal part 20, which faces the device hole 14, and the terminal part 20 on the input and output sides and then curing the resin component contained in the flame retardant solder resist ink.

The solder resist ink for flame retardant solder resist layer 18 formation may be the same as or different from the solder resist ink for the backside flame retardant solder resist layer 17 formation. The flame retardant solder resist layer 18 has a flame retaradance of V=0 as determined according to UL94V standards. Examples of resins for the formation of the flame retardant solder resist layer 18 include flame retardant urethane resins, flame retardant polyimides, and flame retardant epoxy resins. They may be used either solely or in a combination of two or more. The incorporation of at least one flame retardant component selected from the group consisting of aluminum hydroxide, magnesium hydroxide, and zinc molybdate, together with these resins, is preferred. The flame retardant solder resist layer may contain a flame retardant such as a phosphoric ester. In particular, since the printing wiring board for a plasma display according to the present invention is used in a folded state, the flame retardant solder resist layer 18 is preferably flexible. Among the above resin components, resins containing flame retardant polyurethane or flame retardant polyimide are particularly preferred. The thickness of the flame retardant solder resist layer 18 thus formed is generally in the range of 5 to 60 μm, preferably in the range of 10 to 25 μm.

In forming the flame retardant solder resist layer 18, in some cases, thermal shrinkage occurs at the time of heat curing of the resin component for forming the flame retardant solder resist layer 18. Thermal shrinkage of the resin in the formation of the flame retardant solder resist layer 18 sometimes causes warpage distortion in the printed wiring board 10 for a plasma display. Specifically, warpage distortion is likely to occur in the printed wiring board 10 for a plasma display with the flame retardant solder resist layer 18 facing inward. When the warpage distortion occurs in the printed wiring board 10 for a plasma display, positioning accuracy between the terminal electrode provided in the electronic components is lowered and, at the same time, positioning between the printed wiring board for a plasma display with electronic components mounted therein (semiconductor device) and the terminal provided at the end part of the glass substrate in the plasma display panel also becomes very difficult. Accordingly, in the present invention, preferably, when the flame retardant solder resist ink is coated, in expectation of shrinkage derived from curing of the flame retardant solder resist layer 18, in such a state that warpage distortion is applied to the insulating film 11 in a direction opposite to the warpage distortion caused during curing of the flame retardant solder resist layer 18, the flame retardant solder resist ink is coated and cured. In coating the flame retardant solder resist ink, applying reverse warpage is advantageous in that, even when the resin component contained in the flame retardant solder resist ink is heat shrunken upon heat curing, the warpage distortion caused by thermal shrinkage is cancelled by previously applied reverse warpage, and, as a result, advantageously, warpage distortion does not substantially occur in the printed wiring board for a plasma display.

After coating of the flame retardant solder resist ink for flame retardant solder resist layer 18 formation, the assembly is heated to a temperature at which the resin component contained in the flame retardant solder resist ink is cured, whereby the resin component is cured to form the flame retardant solder resist layer 18. The heating temperature at that time may vary depending upon the resin component contained in the flame retardant solder resist ink used. In general, however, the heating temperature is in the range of 30 to 250° C., preferably 30 to 180° C. In this case, before the step of heat curing, the step of expelling foams and the like, which are often formed by the step of coating, from the uncured flame retardant solder resist layer 18 may be provided.

Thus, after the formation of the flame retardant solder resist layer 18, a plating layer 19 is formed on the surface of the terminal part 20 exposed from the flame retardant solder resist layer 18.

For example, a tin plating layer, a gold plating layer, a nickel-gold plating layer, a nickel-palladium-gold plating layer, a palladium plating layer, a solder plating layer, and a lead-free-solder plating layer may be mentioned as the plating layer 19 formed on the terminal part 20. The thickness of the plating layer is generally in the range of 0.2 to 15 μm, preferably 0.3 to 10 μm. The plating layer is not limited to a single-layer structure. Specifically the plating layer may be a laminate of plating layers of different metals or a laminate of plating layers of an identical metal. For example, a method may also be adopted in which, after the formation of a wiring pattern 12, a thin tin plating layer (pretin plating layer: thickness=generally 0.01 to 0.1 μm) is formed on the whole wiring pattern, and a flame retardant solder resist layer 18 is then formed, followed by the formation of a plating layer (main plating layer: thickness=generally 0.2 to 0.5 μm) on the terminal part 20 exposed from the flame retardant solder resist layer.

Figure 3:
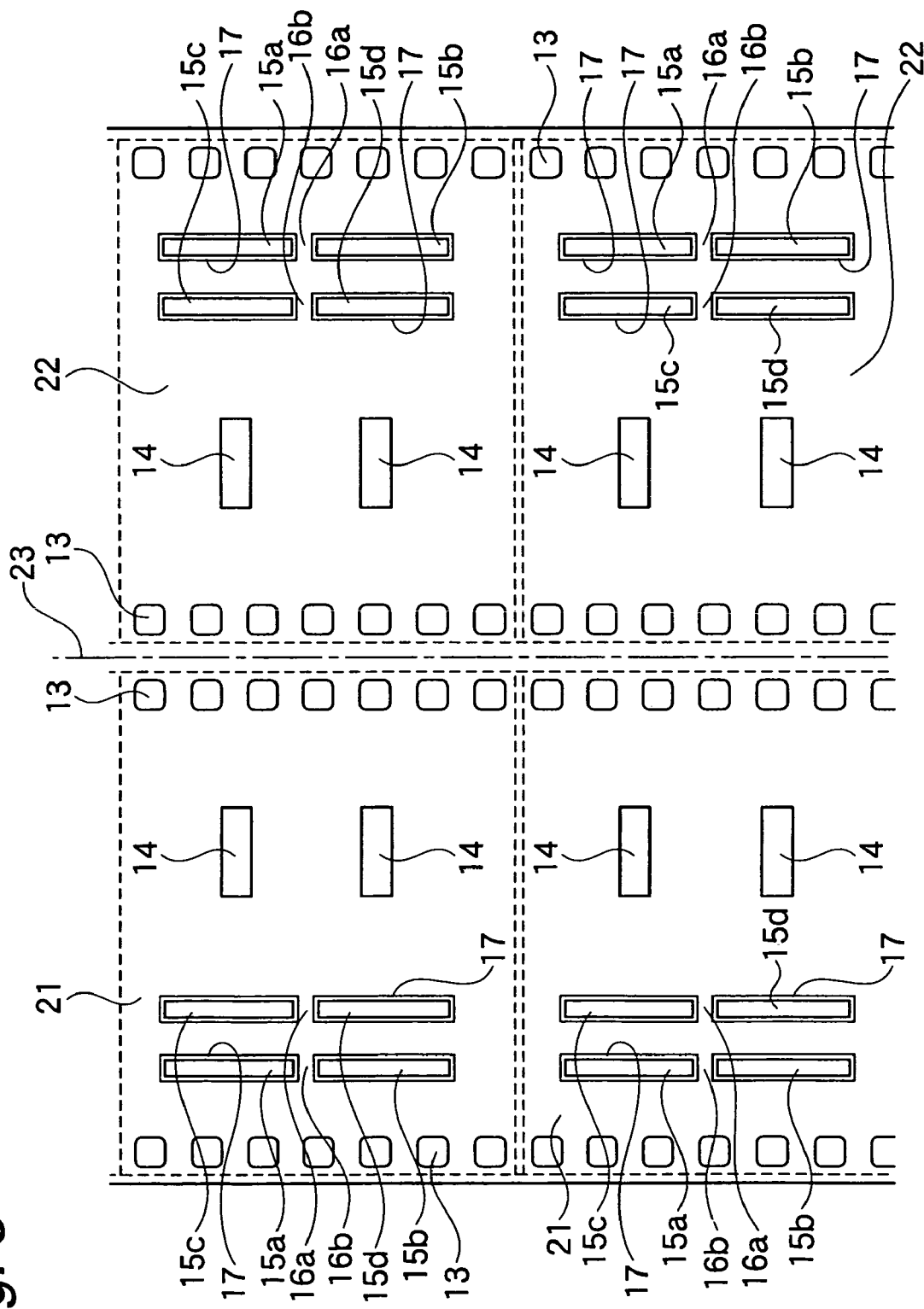
FIG. 3 is a plan view showing another embodiment of the printed wiring board for a plasma display according to the present invention.

An embodiment in which one film carrier is formed in the widthwise direction of a long insulating film formed of polyimide or the like has been explained above. In the printed wiring board for a plasma display according to the present invention, preferably, as shown in FIG. 3, a plurality of film carriers are arranged in the widthwise direction of the insulating film 11. FIG. 3 shows an embodiment in which a film carrier A and a film carrier B are juxtaposed in two rows in the widthwise direction of the insulating film 11. Sprocket holes 13 are independently provided in the film carrier A and the film carrier B. When the film carrier is provided in multiple rows, external sprocket holes may also be formed, separately from the sprocket holes 13 for the respective film carriers, on the outside in the widthwise direction in order to transfer the long insulating film provided with film carriers in multiple rows. When the external sprocket holes 24 are formed separately from the sprocket holes 13 for respective individual film carriers, the external sprocket holes 24 may be used without the use of the sprocket holes 13 for respective individual film carriers in the production of the printed wiring board for a plasma display according to the present invention. Therefore, for example, the sprocket holes 13 are not used until an electronic component is mounted on the film carrier A or B. Since the sprocket holes 13 do not have any strain or the like, which is likely to occur in feed of the film carrier, positioning in the mounting of electronic components can be carried out with very high accuracy.

Figure 6:
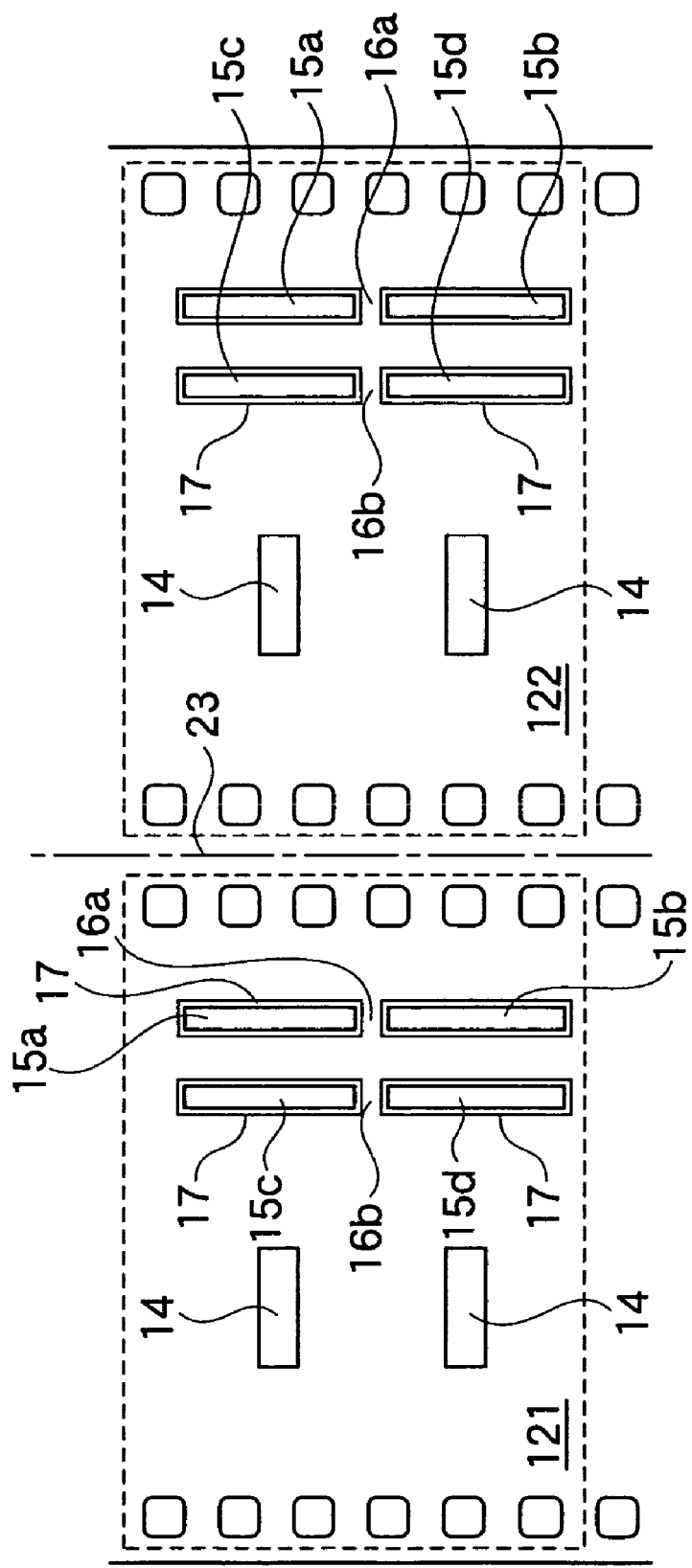
FIG. 6 is a diagram showing an embodiment of a prior art of a printed wiring board for a plasma display in which a film carrier A (121) and a film carrier B (122) are not provided symmetrically with respect to an imaginary boundary line 23 between both the film carriers.

In producing the printed wiring board for a plasma display according to the present invention in multiple rows, film carriers adjacent to each other in the widthwise direction of the insulating film are preferably formed symmetrically with respect to a boundary line between these film carriers. FIG. 3 shows an embodiment in which a film carrier A and a film carrier B are provided in two rows in the widthwise direction of the insulating film 11. The film carrier A and the film carrier B are provided symmetrically with respect to an imaginary boundary line 23 between the film carrier A and the film carrier B. The provision of the film carrier A and the film carrier B symmetrically with respect to an imaginary boundary line 23 between the adjacent film carriers can significantly lower the fraction defective of lifting of the flame retardant solder resist layer 17. On the other hand, for example, as shown in FIG. 6, when the film carrier A indicated by a reference number 121 and a film carrier B indicated by a reference number 122 are not formed symmetrically with respect to an imaginary boundary line 23, the backside flame retardant solder resist layer 17 is likely to be lifted. The reason why the fraction defective can be lowered by forming film carriers symmetrically with respect to an imaginary boundary line 23 between the adjacent film carriers has not been elucidated yet. Statistically, however, there is a tendency that the formation of film carriers symmetrically with respect to the imaginary boundary line 23 can significantly reduce the fraction defective derived from the separation of the backside flame retardant solder resist layer 17, particularly lifting from or around the inter-slit parts 16*a*, 16*b*.

Thus, the printed wiring board 10 for a plasma display according to the present invention is disposed at the edge of a glass substrate for a plasma display panel and, in use, is folded toward the backside of the plasma display panel. Even in the case where an electronic component is mounted on this printed wiring board for a plasma display and a voltage of 60 to 70 V or higher is applied, the backside flame retardant solder resist layer 17, in which heat is likely to accumulate, is not separated and, even after use for a long period of time, the flame retardance of the whole printed wiring board is V=0 as determined according to UL94V standards.

Therefore, according to the present invention, excellent flame retardance can be imparted to the printed wiring board for a plasma display to which high voltage should be applied. Further, even after long-term use, the flame retardance of the printed wiring board for a plasma display does not vary.

EXAMPLES

The printed wiring board for a plasma display according to the present invention and the production process thereof will be further described with reference to the following examples, but it should be construed that the present invention is in no way limited to those examples.

Example 1

Device holes, folding slits, and sprocket holes were formed by a punching press in a polyimide film having an average thickness of 75 μm (Upilex S, manufactured by Ube Industries, Ltd.). In this example, as shown in FIG. 3, film carriers A and B were formed in two rows in the widthwise direction of a long polyimide film. The film carrier A and the film carrier B were formed symmetrically with respect to an imaginary boundary line 23 between the film carrier A and the film carrier B. A folding slit is formed in two places for each film carrier, and each of the folding slits are-provided in a two divided form.

Subsequently, a copper layer having an average thickness of 25 μm was disposed on one side of the insulating film to prepare a substrate film.

A backside flame retardant solder resist ink was coated by screen printing onto the slit parts of the substrate film from the backside (side not provided with the copper layer). The backside flame retardant solder resist ink used was a heat curable polyimide resin having a flame retardance of V=0 as determined according to UL94V standards. That is, the polyimide resin per se is flame-retardant. This resin was subjected to a folding endurance test with a folding endurance testing apparatus shown in FIG. 7. In this test, a weight of 200 g was suspended, and folding to right and left was carried out each at 90 degrees in 50 reciprocating folding cycles. As a result, this resin posed no problem in this test.

The above backside flame retardant solder resist ink was coated by screen printing onto the slit parts. Thereafter, the assembly was allowed to stand at 25° C. for 2 min under the atmospheric pressure to expel most foams and pinholes (foams having a diameter of not less than 1 mm) present in the backside flame retardant solder resist ink coating layer.

The substrate film with the backside flame retardant solder resist ink coating layer formed thereon was heated at 160° C. for 4 min to cure the flame retardant polyimide resin in the backside flame retardant solder resist.

The cured backside flame retardant solder resist layer was visually inspected. As a result, it was found that the amount of foams and pinholes remaining unexpelled present around the slits was small.

Next, a photosensitive resin was coated onto the surface of the copper layer, and the photosensitive resin was exposed and developed to form a desired pattern. The pattern thus formed was used as a masking material for selective etching of the copper layer to form a wiring pattern formed of the copper layer. After the formation of the wiring pattern, the masking material formed of the photosensitive resin formed by exposure and development was removed by washing with an alkali.

While applying reverse warpage to the substrate, a urethane flame retardant solder resist ink having a flame retardance of V=0 as determined according to UL94V standards which did not pose any problem in 50 reciprocating folding cycles in the above folding endurance test was coated by screen printing onto the surface of the formed wiring pattern so that the thickness of the coating after curing was 20 μm. The coating was then heated at 160° C. for 4 min to cure the resin component contained in the flame retardant solder resist ink. In this case, the shrinkage of the resin by curing of the resin was cancelled by the previously applied reverse warpage, and, consequently, warpage distortion did not substantially develop in the printed wiring board.

After the formation of the flame retardant solder resist layer 18, a tin plating layer having an average thickness of 0.5 μm was formed at the terminal part exposed from the flame retardant solder resist layer to prepare 30 lots of a printed wiring board tape for a plasma display.

The appearance of the slit parts of the printed wiring board for a plasma display was visually inspected from the backside of printed wiring board. As a result, pinholes were observed in 0.9% of the backside flame retardant solder resist layers. For each lot, abnormal appearance caused by lifting of the solder resist between the surface slits was not observed.

Comparative Example 1

Printed wiring boards for a plasma display were produced in the same manner as in Example 1, except that the backside flame retardant solder resist ink was cured immediately after coating without standing.

The appearance of the printed wiring boards for a plasma display thus obtained was visually inspected in the same manner as in Example 1. As a result, pinholes were found in the backside flame retardant solder resist layer in about 3% of the printed wiring boards.

Reference Example 1

Printed wiring boards for a plasma display were produced in the same manner as in Example 1, except that, as shown in FIG. 6, wiring patterns were formed asymmetrically with respect to an imaginary boundary line 23.

In 3 lots of printed wiring board tapes for a plasma display among 30 lots of printed wiring board tapes thus obtained, printed wiring boards in which the solder resist had been lifted between the surface slits were observed.

As described above in detail, in the printed wiring board for a plasma display having a flame retardance of V=0 as determined according to UL94V standards according to the present invention, after coating of a backside solder resist ink onto slit parts, pinholes within the solder resist ink are expelled, and, by virtue of this constitution, no lifting occurs between the divided wiring pattern-side slits. Therefore, the printed wiring board is highly useful for a plasma display to which a voltage of not less than 60 V is applied.

What is claimed is:

1. A printed wiring board for a plasma display, comprising: an insulating film having a folding slit(s) provided at its folding position; a wiring pattern provided on at least one surface of the insulating film; and a flame retardant solder resist layer provided so as for a terminal part to be exposed on the surface of the wiring pattern, wherein said folding slit being provided in a divided form in the longitudinal direction of the slit, a flame retardant solder resist layer being provided on the backside of said folding slit, foams in said backside flame retardant solder resist layer formed in the divided slit region having been expelled.

2. The printed wiring board for a plasma display according to claim 1, wherein a film carrier comprising said insulating film having a folding slit(s) in its folding position, said wiring pattern provided on at least one surface of the insulating film, and said flame retardant solder resist layer provided so as for a terminal part to be exposed on the surface of the wiring pattern is provided in multiple rows in the widthwise direction of the insulating film.

3. The printed wiring board for a plasma display according to claim 2, wherein said printed wiring board for a plasma display is provided in multiple rows in the widthwise direction of the insulating film and the film carriers adjacent to each other in the widthwise direction of the insulating film are provided symmetrically with respect to a boundary line between both the film carriers.

4. The printed wiring board for a plasma display according to claim 1, wherein said flame retardant solder resist layer contains at least one flame retardant component selected from the group consisting of aluminum hydroxide, magnesium hydroxide, and zinc molybdate.

5. The printed wiring board for a plasma display according to claim 1, wherein said flame retardant solder resist layer is formed of a flame retardant urethane resin or a flame retardant polyimide resin.

6. The printed wiring board for a plasma display according to claim 1, wherein said flame retardant solder resist layer is formed of at least two flame retardant resins selected from the group consisting of flame retardant urethane resins, flame retardant polyimide resins, and flame retardant epoxy resins.

7. The printed wiring board for a plasma display according to claim 1, wherein said backside flame retardant solder resist layer has flame retardance on a level of V=0 as determined according to UL94V standards.

8. The printed wiring board for a plasma display according to claim 1, wherein, in forming said flame retardant solder resist layer, said insulating film has been reversely warped to offset warpage distortion caused in the formation of said flame retardant solder resist layer.

9. The printed wiring board for a plasma display according to claim 4, wherein said flame retardant solder resist layer is formed of a flame retardant urethane resin or a flame retardant polyimide resin.

10. The printed wiring board for a plasma display according to claim 4, wherein said flame retardant solder resist layer is formed of at least two flame retardant resins selected from the group consisting of flame retardant urethane resins, flame retardant polyimide resins, and flame retardant epoxy resins.

11. A process for producing a printed wiring board for a plasma display, comprising the steps of: providing an insulating film; forming a folding slit in the form of a plurality of divided folding slits in said insulating film at its position corresponding to a position at which said insulating film is to be folded; disposing an electrically conductive metal layer on a surface of said insulating film; forming a backside flame retardant solder resist layer on the backside of the insulating film, which is reverse side of said electrically conductive metal layer, at its folding slit formed position; forming a photosensitive resin layer on the surface of said electrically conductive metal layer; exposing and developing said photosensitive resin layer to form a desired pattern; selectively etching the electrically conductive metal layer using the pattern as a masking material to form a wiring pattern; then coating a flame retardant solder resist ink so that said wiring pattern in its terminal part is exposed, thereby forming a flame retardant solder resist layer and thus to produce a printed wiring board for a plasma display, wherein the step of expelling foams contained in the coated backside flame retardant solder resist ink is provided between the step of coating the backside flame retardant solder resist ink onto the backside of the insulating film in its folding slit formed position and the step of curing the backside flame retardant solder resist ink to form the backside flame retardant solder resist layer.

12. The process for producing a printed wiring board for a plasma display according to claim 11, wherein the step of expelling foams contained in the backside flame retardant solder resist ink coated on said divided slits is carried out, in a stage after the step of coating the flame retardant solder resist ink and before the step of curing the resin in the backside flame retardant solder resist ink, to allow said backside flame retardant solder resist ink coating layer formed by coating to stand for 0.5 to 6 min to expel foams contained in the coated backside flame retardant solder resist ink.

13. The process for producing a printed wiring board for a plasma display according to claim 11, wherein said backside flame retardant solder resist ink coating layer is allowed to stand in the temperature range of 15 to 80° C. for 0.5 to 6 min.

14. The process for producing a printed wiring board for a plasma display according to claim 11, wherein said backside flame retardant solder resist ink coating layer is allowed to stand in the temperature range of 15 to 80° C. under the atmospheric pressure or reduced pressure for 0.5 to 6 min.

15. The process for producing a printed wiring board for a plasma display according to claim 9, wherein the viscosity of the backside flame retardant solder resist ink for backside flame retardant solder resist layer formation is in the range of 500 to 10000 cps at 25° C.

16. The process for producing a printed wiring board for a plasma display according to claim 12, wherein said backside flame retardant solder resist ink coating layer is allowed to stand in the temperature range of 15 to 80° C. for 0.5 to 6 min.

17. The process for producing a printed wiring board for a plasma display according to claim 12, wherein said backside flame retardant solder resist ink coating layer is allowed to stand in the temperature range of 15 to 80° C. under the atmospheric pressure or reduced pressure for 0.5 to 6 min.

* * * * *

UNITED STATES PATENT AND TRADEMARK OFFICE
CERTIFICATE OF CORRECTION

PATENT NO.         : 7,518,065 B2                                           Page 1 of 1
APPLICATION NO. : 11/267792
DATED              : April 14, 2009
INVENTOR(S)        : Fujii It is certified that error appears in the above-identified patent and that said Letters Patent is hereby corrected as shown below:

Column 18, Claim 15, Line 17, "according to Claim 9" should read
-- according to Claim 11 --

Signed and Sealed this

First Day of September, 2009

David J. Kappos
*Director of the United States Patent and Trademark Office*